(12) United States Patent
Du (10) Patent No.: US 7,081,667 B2
(45) Date of Patent: Jul. 25, 2006

(54) POWER LED PACKAGE

(75) Inventor: Shawn X. Du, Macedonia, OH (US)

(73) Assignee: GELcore, LLC, Valley View, OH (US)

( * ) Notice: Subject to any disclaimer, the term of this patent is extended or adjusted under 35 U.S.C. 154(b) by 105 days.

(21) Appl. No.: 10/949,929

(22) Filed: Sep. 24, 2004

(65) Prior Publication Data

US 2006/0071329 A1    Apr. 6, 2006

(51) Int. Cl.
*H01L 21/44* (2006.01)

(52) U.S. Cl. .................. 257/668; 257/676; 257/691

(58) Field of Classification Search ............... 257/666, 257/676, 690, 691, 668; 438/123
See application file for complete search history.

(56) References Cited

U.S. PATENT DOCUMENTS

| | | | |
|---|---|---|---|
| 5,309,001 A * | 5/1994 | Watanabe et al. ............. 257/99 |
| 5,508,577 A | 4/1996 | Shiga et al. |
| 5,517,057 A * | 5/1996 | Beilstein et al. ............ 257/686 |
| 5,780,933 A | 7/1998 | Ohmori et al. |
| 5,914,501 A | 6/1999 | Artle et al. |
| 5,959,316 A | 9/1999 | Lowery et al. |
| 5,962,971 A | 10/1999 | Chen |
| 5,998,232 A | 12/1999 | Maruska |
| 6,037,719 A * | 3/2000 | Yap et al. ................. 315/169.3 |
| 6,043,557 A * | 3/2000 | Phelps et al. ................ 257/668 |
| 6,054,725 A * | 4/2000 | Liedenbaum et al. .......... 257/91 |
| 6,114,756 A * | 9/2000 | Kinsman .................... 257/676 |
| 6,204,523 B1 | 3/2001 | Carey et al. |
| 6,274,924 B1 | 8/2001 | Carey et al. |
| 6,320,311 B1 * | 11/2001 | Nakaya et al. .............. 313/506 |
| 6,335,548 B1 | 1/2002 | Roberts et al. |
| 6,369,506 B1 | 4/2002 | Hata |
| 6,486,499 B1 | 11/2002 | Krames et al. |
| 6,498,355 B1 | 12/2002 | Harrah et al. |
| 6,501,102 B1 | 12/2002 | Mueller-Mach et al. |
| 6,501,103 B1 | 12/2002 | Jory et al. |
| 6,514,782 B1 | 2/2003 | Wierer, Jr. et al. |
| 6,635,903 B1 | 10/2003 | Kato et al. |
| 6,642,550 B1 | 11/2003 | Whitworth et al. |
| 6,646,291 B1 | 11/2003 | Takagi |
| 6,650,018 B1 * | 11/2003 | Zhao et al. .................. 257/775 |
| 6,670,751 B1 | 12/2003 | Song et al. |
| 6,696,704 B1 | 2/2004 | Maeda et al. |
| 6,713,877 B1 | 3/2004 | Hirano et al. |
| 6,747,415 B1 * | 6/2004 | Moser ...................... 315/169.3 |
| 6,885,036 B1 * | 4/2005 | Tarsa et al. ................... 257/99 |
| 6,958,498 B1 * | 10/2005 | Shelton et al. ................ 257/99 |
| 2001/0045631 A1 * | 11/2001 | Kinsman .................... 257/676 |

(Continued)

*Primary Examiner*—Hoai Pham
*Assistant Examiner*—Shrinivas H. Rao
(74) *Attorney, Agent, or Firm*—Fay, Sharpe, Fagan, Minnich & McKee, LLP (57) ABSTRACT

In a chip package (10, 10', 110, 210), first and second electrical power buses (14, 14', 16, 16', 114, 116, 214, 216) are each formed of an electrical conductor having a chip bonding portion (20, 22, 120, 122, 220, 222) and a lead portion (26, 26', 28, 28', 126, 128, 226, 228) extending away from the chip bonding portion. The chip bonding portions of the first and second electrical power buses have edges (32, 34, 132, 134, 232, 234) spaced apart from one another to define an extended electrical isolation gap (40, 140, 240). A plurality of chips (42, 44, 46, 142, 143, 144, 145, 146, 147, 148, 242) straddle the extended electrical isolation gap and are electrically connected with the first and second electrical power buses to receive electrical power from the first and second electrical power buses.

20 Claims, 7 Drawing Sheets

U.S. PATENT DOCUMENTS

| | | |
|---|---|---|
| 2002/0097579 A1 | 7/2002 | Stalions |
| 2003/0015721 A1 | 1/2003 | Slater et al. |
| 2003/0075724 A1 | 4/2003 | Wang et al. |
| 2003/0107316 A1 | 6/2003 | Murakami et al. |
| 2004/0026708 A1 | 2/2004 | Chen et al. |

* cited by examiner

POWER LED PACKAGE

BACKGROUND

The following relates to the lighting arts. It especially relates to high intensity light emitting diode chip packages, and to methods for producing such packages, and will be described with particular reference thereto. However, the following will also find application in conjunction with other solid state light emitting chip packages such as vertical cavity surface emitting laser packages, in conjunction with solid state electronics packaging, and the like.

One issue in light emitting chip packaging is scalability. A light emitting chip, such as a light emitting diode chip or a laser diode chip, is generally a relatively small light source. Moreover, while light output efficiencies continue to improve due to improved chip designs, a single light emitting chip may be inadequate for some high intensity illumination applications. Accordingly, a plurality of light emitting chips are sometimes arranged in an array, strip, or other configuration to provide higher cumulative illumination intensities and/or to provide spatially extended light sources. Depending on the light output of each chip, and the illumination intensity and characteristics required by the application, different numbers and arrangements of light emitting chips are used.

Another issue in light emitting chip packaging is the mounting arrangement. If the package includes solderable leads, these leads should be well-separated from one another to promote soldering without shorting across the leads. In one common design, a lead flame has a first lead including cup receiving the light emitting chip, and a second lead. The light emitting chip is connected with the leads by wire bonding, and an encapsulant is disposed over the chip and ends of both leads to secure them together. The distal ends of the leads extend outside of the encapsulant for soldering connection.

In some applications, a surface mount package is preferred, in which solderable bonding pads are disposed on the backside of the package opposite the light-emitting side. In one approach, a sub-mount supports the light emitting chip on one side, and has the bonding pads disposed on the backside of the sub-mount. To connect the light emitting chip on the frontside with the backside bonding pads, vias are formed through the sub-mount.

Yet another issue in light emitting chip packaging is thermal heat sinking. The sub-mount, if used, is generally a thermally conductive material to promote heat extraction from the light emitting chip. Some of the highest thermal conductivity materials, such as metals, are also electrically conductive; however, the sub-mount generally should be electrically insulative. Hence, the sub-mount is typically made of a thermally conductive but electrically insulating material such as a ceramic, silicon carbide, sapphire, or the like.

Many of these issues also pertain to non-optical chip packages, such as integrated circuit (IC) chip packages. In particular, such packages sometimes generate a substantial amount of heat, and it is sometimes advantageous for such packages to be surface mountable. Moreover, if the package includes a large number of IC chips, it is advantageous for the chips to be arranged in a rectangular array or other compact configuration so as to readily fit into a device housing or other confined space.

The following contemplates improved apparatuses and methods that overcome the above-mentioned limitations and others.

BRIEF SUMMARY

According to one aspect, a chip package is disclosed. An electrically insulating substrate has a front principal side. Planar first and second electrical power buses each have a chip bonding portion and a lead portion extending away from the chip bonding portion. At least the chip bonding portions of the first and second electrical power buses are disposed on the front principal side of the substrate and have edges spaced apart from one another to define an extended electrical isolation gap. A plurality of chips straddle the extended electrical isolation gap and are electrically connected with the first and second electrical power buses to receive electrical power via the first and second electrical power buses.

According to another aspect, a chip package is disclosed. First and second electrical power buses are each formed of an electrical conductor having a chip bonding portion and a lead portion extending away from the chip bonding portion. The chip bonding portions of the first and second electrical power buses have edges spaced apart from one another to define an extended electrical isolation gap. A plurality of chips straddle the extended electrical isolation gap and are electrically connected with the first and second electrical power buses to receive electrical power from the first and second electrical power buses.

According to yet another aspect, a chip operating method is provided. First and second electrical power buses are formed each having a chip bonding portion and a lead portion extending away from the chip bonding portion. At least the chip bonding portions of the formed first and second electrical power buses are disposed on a front principal side of an electrically insulating substrate with edges of the chip bonding portions arranged spaced apart from one another to define an extended electrical isolation gap. A plurality of chips are bonded across the extended electrical isolation gap and are electrically connected with the first and second electrical power buses to receive electrical operating power from the first and second electrical power buses.

Numerous advantages and benefits of the present invention will become apparent to those of ordinary skill in the art upon reading and understanding the present specification.

BRIEF DESCRIPTION OF THE DRAWINGS

The invention may take form in various components and arrangements of components, and in various process operations and arrangements of process operations. The drawings are only for purposes of illustrating preferred embodiments and are not to be construed as limiting the invention. Except where indicated, layer thicknesses and other dimensions are not drawn to scale.

DETAILED DESCRIPTION OF PREFERRED EMBODIMENTS

Figure 1:
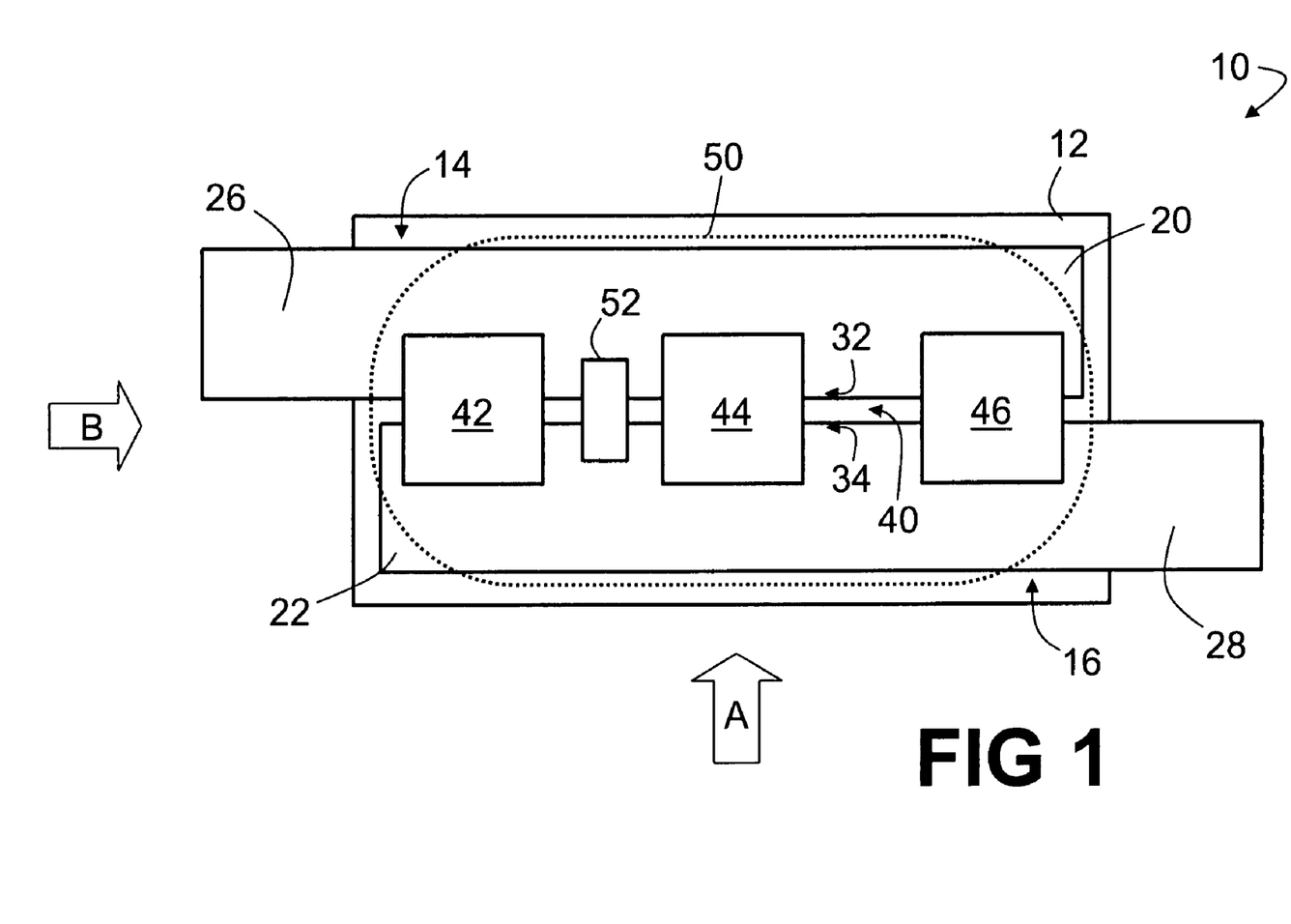
FIG. 1 shows a top view of a chip package including three chips.
Figures 1A, 1B:
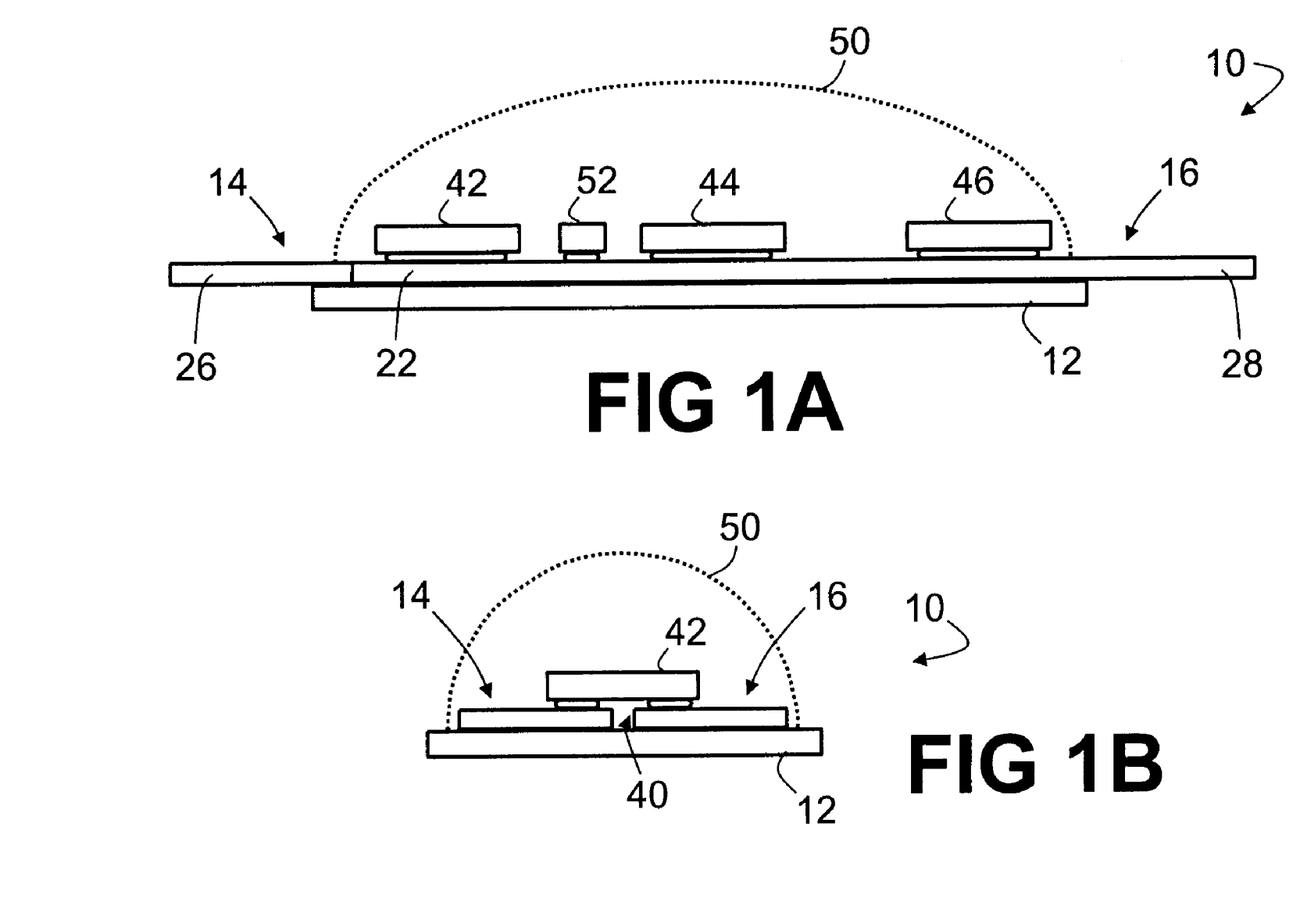
FIG. 1A shows a side view of the chip package of FIG. 1 viewed from the direction "A" indicated in FIG. 1A.
FIG. 1B shows a side view of the chip package of FIG. 1 viewed from the direction "B" indicated in FIG. 1.

With reference to FIGS. 1, 1A, and 1B, a chip package 10 includes an electrically insulating substrate 12 on which planar electrical power buses 14, 16 are disposed. The power buses 14, 16 are rectangular strips of metal or another electrical conductor, and are arranged parallel with one another and relatively offset from one another to define neighboring and non-neighboring portions of each strip. The neighboring portions define chip bonding portions 20, 22 of the buses 14, 16, respectively, while the non-neighboring portions define lead portions 26, 28 of the buses 14, 16, respectively. The chip bonding portions 20, 22 of the buses 14, 16 are arranged with edges 32, 34 (labeled only in FIG. 1) arranged spaced apart from one another to define an extended electrical isolation gap 40. The extended electrical isolation gap 40 is extended in the direction parallel to the rectangular strips of the planar electrical power buses 14, 16 (that is, in the direction "B" labeled in FIG. 1). In the direction transverse to the planar electrical power buses 14, 16 (that is, in the direction "A" labeled in FIG. 1), the gap 40 is narrow.

A plurality of chips 42, 44, 46 straddle the gap 40 and include power-receiving electrodes electrically connected with the first and second electrical power buses 14, 16, respectively. Each of the power-receiving electrodes can be a single electrode or an array or other distribution of electrically common electrodes. For example, the chips 42, 44, 46 are in some embodiments light emitting diode chips having a flip-chip configuration in which the electrodes are distributed across the area of the chip to promote current spreading and lateral current uniformity. In other embodiments, the chips 42, 44, 46 are laser diode chips, electronic integrated circuit chips, or the like. The lead portions 26, 28 of the buses 14, 16 extend off the substrate 12 and are suitably connected with an electrical power source (not shown). The buses 14, 16 conduct the electrical power to provide operating power to the chips 42, 44, 46.

A suitable encapsulant 50 (boundaries of which are indicated by dotted lines in FIGS. 1, 1A, and 1B) surrounds the chips 42, 44, 46 and the chip bonding portions 20, 22 of the buses 14, 16. If the chips 42, 44, 46 are light emitting diode chips, laser diode chips, vertical cavity surface emitting laser diode chips, or other light emitting chips, then the encapsulant 50 should be light-transmissive at least for the light emitted by the chips. Optionally, a wavelength-converting phosphor is dispersed or otherwise incorporated into the encapsulant 50. For example, in some embodiments the chips 42, 44, 46 are group III-nitride based light emitting diode chips emitting blue or ultraviolet light, and a white phosphor is incorporated into the encapsulant 50 to convert the blue or ultraviolet light into white light. For either light emitting or non-light emitting chips, the encapsulant 50 can provide hermetic sealing against moisture, potting to promote robustness against shocks, vibrations, and the like, or can perform other encapsulant functions known in the art. In the chip package 10, a single encapulant 50 encapsulates all three chips 42, 44, 46; however, in other contemplated embodiments each chip is separately encapsulated. In still other contemplated embodiments the encapsulant is omitted entirely.

The chip package 10 is suitably manufactured as follows. The planar first and second electrical power buses 14, 16 are cut out of sheet metal having the desired thickness. The selected metal should be highly electrically conductive and available in sheet metal form. Suitable metals include, but are not limited to, stainless steel and copper. Optionally, the sheet metal is tinned or otherwise surface-treated, either before or after the electrical power buses 14, 16 are cut out, to provide improved solderability. The thusly formed planar electrical power buses 14, 16 are bonded or otherwise secured to the electrically insulating substrate 12 using substantially any bonding approach, such as by using an adhesive, or clips, screws, or other fasteners. (The term "electrically insulating substrate" includes substrates formed of an electrically conductive material which are coated with a dielectric material or other electrically insulating film to make the substrate electrically insulating). The electrical power buses 14, 16 are secured to the substrate 12 with the edges 32, 34 arranged spaced apart from one another to define the extended electrical isolation gap 40. Optionally, a thermally conductive but electrically insulating material (not shown) is disposed in the gap 40. The chips 42, 44, 46 are placed across the gap 40 and the chip power-receiving electrodes are soldered, thermosonically bonded, wire bonded, or otherwise electrically connected with the power buses 14, 16.

In some embodiments, the electrically insulating substrate 12 is a printed circuit board in which the printed circuitry only contacts the lead portions 26, 28 of the buses 14, 16, respectively, to deliver electrical power thereto.

The chip package 10 has low mechanical stress. The planar power buses 14, 16 are preferably thick enough to provide substantial heat sinking for the operating chips 42, 44, 46. Heat flow rate along the power buses 14, 16 is given by:

$$H = -2 \cdot k \cdot A \cdot \frac{dT}{dx}, \qquad (1)$$

where H denotes the heat generated by the chips 42, 44, 46 (for example, in units of watts or joules/second), k is the thermal conductivity of the bus material (for example, in units of joules/m·° C.·s), A is the cross-sectional area of the planar power bus, and dT/dx is the drop in temperature per unit length of along each power bus 14, 16. The factor of two arises because there are two power buses, and the negative sign indicates heat removal. The chip heat generation H is readily measured or estimated by those skilled in the art, and is typically included on datasheets for commercial light emitting diode chips, laser chips, IC chips, and the like. Thus, using Equation (1) in conjunction with knowledge of the heat generated by the chips 42, 44, 46, a suitable area or thickness of the power buses 14, 16 can be determined which is effective for the buses 14, 16 alone to provide adequate heat removal as indicated by the rate of temperature drop (dT/dx) along the buses. In some embodiments, planar power buses 14, 16 with thicknesses of about 10 mil (0.25 mm) provide sufficient heat removal for the chips 42, 44, 46. In contrast, conventional printed circuitry pads typically have lower thicknesses of about 2–4 mils (0.05–0.1 mm). Optionally, the substrate 12 can also be thermally conductive to provide an additional heat removal pathway.

It will be appreciated that the chip package 10 is highly extensible, insofar as substantially any number of chips can be mounted by suitably lengthening the chip bonding portions 20, 22 of the buses 14, 16 to lengthen the extended electrical isolation gap 40 to accommodate additional chips. In some embodiments, an electrostatic discharge (ESD) protection device 52 is electrically connected across the buses 14, 16, in the same manner as the chips 42, 44, 46 are bonded across the gap 40 or in a different manner. The ESD protection device 52 provides electrostatic discharge protection for all three chips 42, 44, 46, as well as for additional chips which may be soldered across the gap 40.

Figure 2:
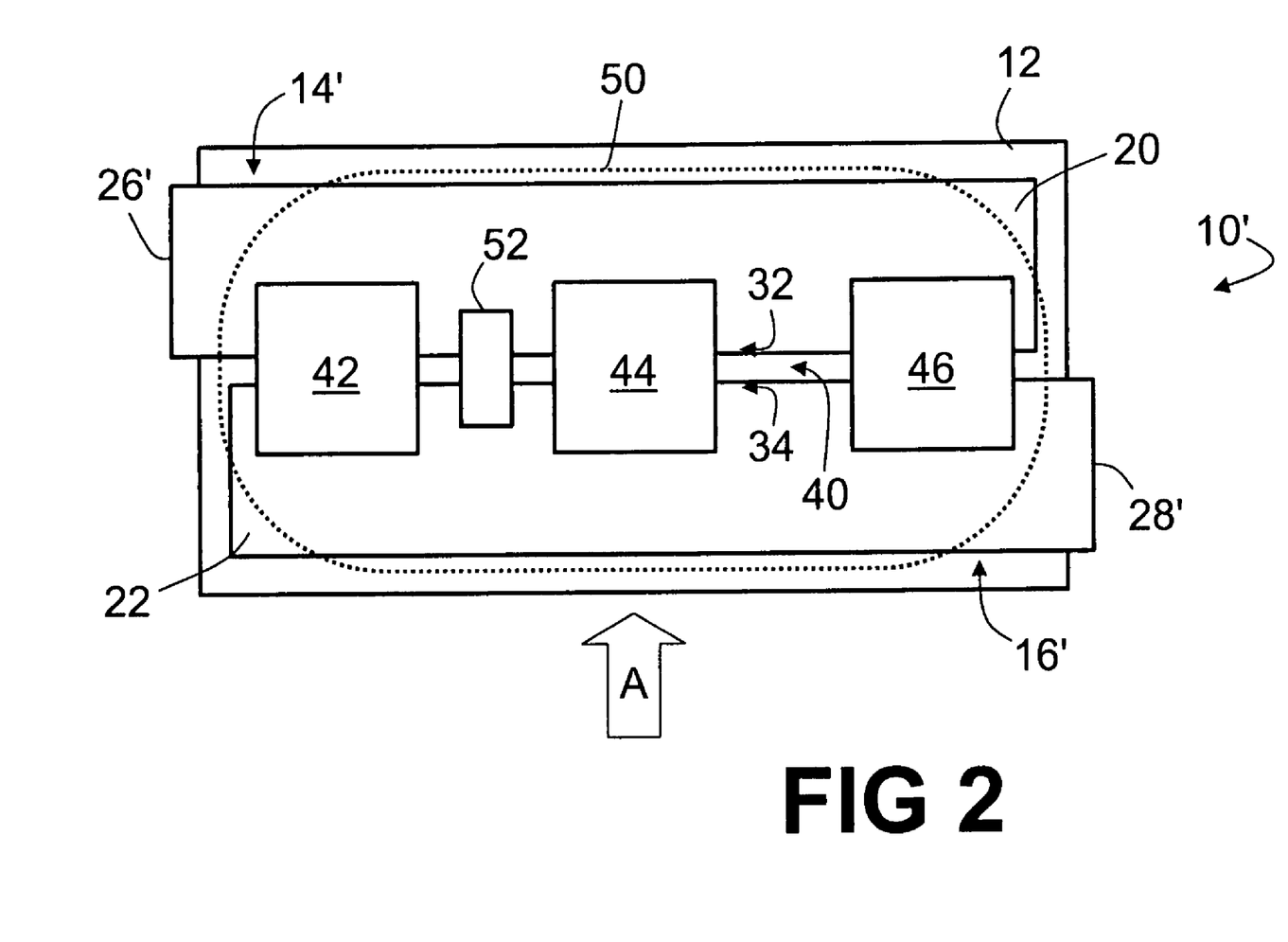
FIG. 2 shows a top view of a chip package including three chips including back side surface mount bonding pads.
Figure 2A:
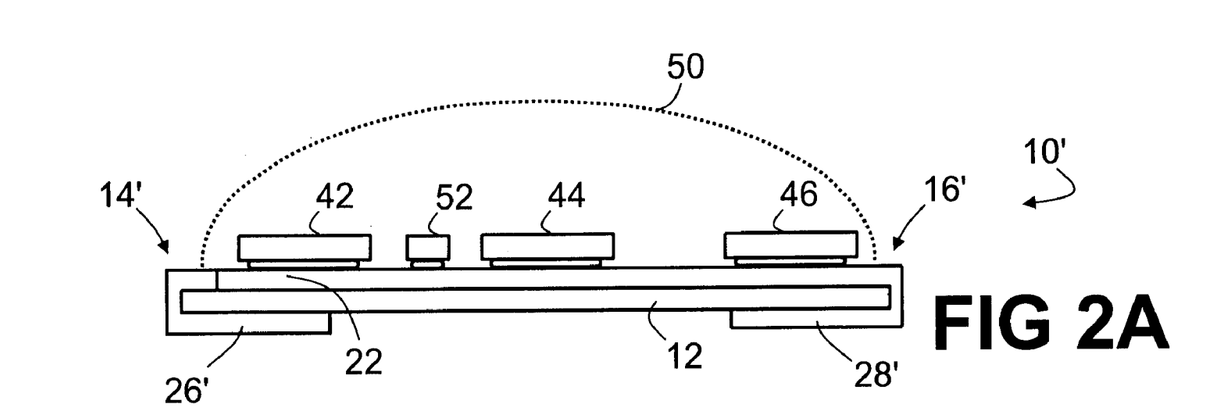
FIG. 2A shows a side view of the chip package of FIG. 2 viewed from the direction "A" indicated in FIG. 2A.
Figure 2B:
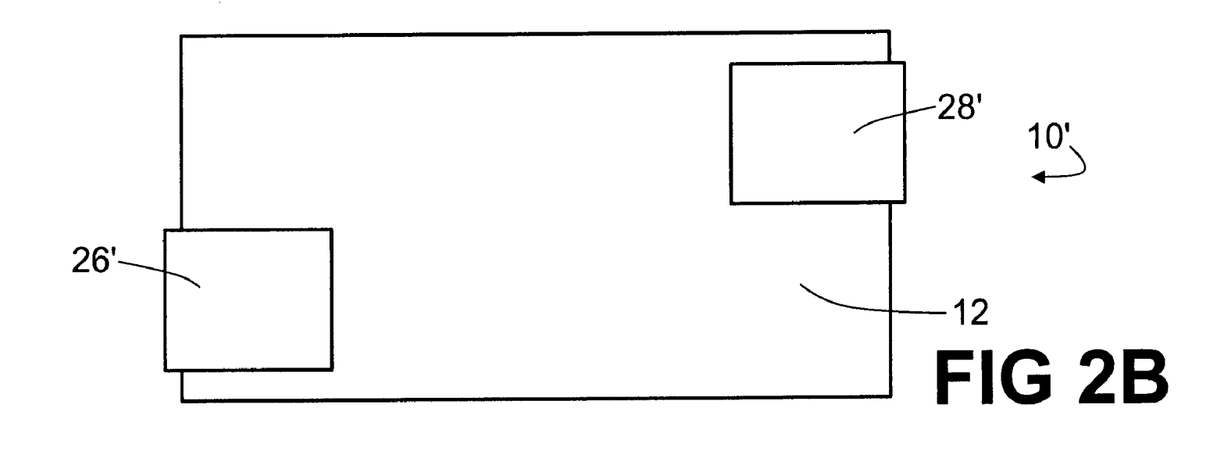
FIG. 2B shows a back side view of the chip package of FIG. 2.

With reference to FIGS. 2, 2A, and 2B, a modified chip package 10' includes most of the same components as the chip package 10. Such repeated components are labeled with identical reference numbers. The modifications involve modified first and second planar electrical power buses 14', 16' which are modified as follows. The lead portions 26, 28 of the buses 14, 16 of chip package 10 which extend off the front principal side of the substrate 12 are wrapped around to a back principal side of the substrate 12 opposite the front principal side to form modified lead portions 26', 28'. Such wrapping of the lead portions 26', 28' is facilitated by the malleability of typical stainless steel, copper, or other sheet metal. By wrapping the lead portions 26', 28' around to the back side of the substrate 12, back side surface mount bonding pads are formed on the back side of the chip package 10', as best seen in FIG. 2B. Thus, the modified chip package 10' is suitable for surface mounting onto a printed circuit board or the like.

The chip packages 10, 10' employ offset rectangular planar electrical power buses. To accommodate additional chips, the overlap of the two offset buses, which defines the chip bonding portion, is lengthened. The effect is that as the number of chips increases, the aspect ratio of the area covered by the chips increases. A linear array or strip of chips is formed. For some applications this may be undesirable. For example, in electronics packages, a high aspect ratio chip package may not comport well with a compact housing or other lower aspect ratio space. For light emitting chip packages, the result of extending the packages 10, 10' to larger numbers of chips is to generate a linear light strip. If a more compact, lower aspect ratio chip package is desired, it is advantageous to modify the chip bonding portions to curve or otherwise reduce the aspect ratio of the electrical isolation gap across which the chips straddle.

Figure 3:
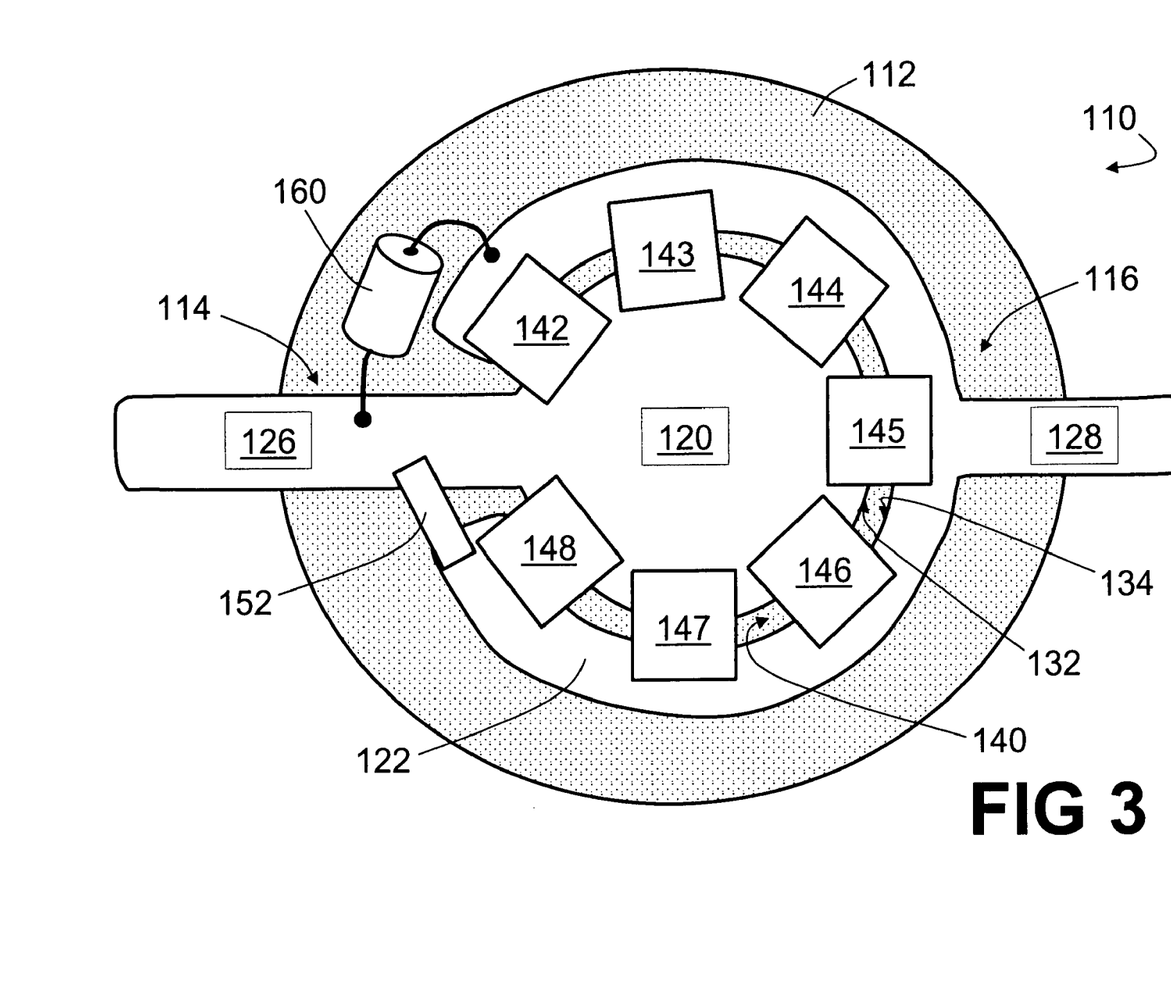
FIG. 3 shows a top view of a chip package including seven chips.

With reference to FIG. 3, a seven chip, low aspect ratio chip package 110 includes a circular substrate 112 planar electrical power buses 114, 116 are disposed on the substrate 112. The power buses 114, 116 are planar sheets of metal or another electrical conductor cut to a selected shape. The power bus 114 includes a chip bonding portion 120 that has an end broadened into a generally circular shape. The power bus 116 includes a chip bonding portion 122 that has a broadened end that wraps around the broadened circumference of the chip bonding portion 120 of the buses 114. A lead portion 126 of the bus 114 extends away from the chip bonding region through an opening in the chip bonding portion 122 of the bus 116. A lead portion 128 of the bus 116 also extends away from the chip bonding region. The chip bonding portions 120, 122 of the buses 114, 116 are arranged with edges 132, 134 arranged spaced apart from one another to define an extended electrical isolation gap 140. The extended electrical isolation gap 140 is not straight, but rather follows the circumference of the chip bonding portion 120. This enables the gap 140 to be arranged more compactly than is possible with a linear gap.

A plurality of chips, namely seven chips 142, 143, 144, 145, 146, 147, 148 in the embodiment of FIG. 3, straddle the gap 140 and are electrically connected with the first and second electrical power buses 114, 116, respectively. The chips 142, 143, 144, 145, 146, 147, 148 are in some embodiments light emitting diode chips having a flip-chip configuration in which the electrodes are distributed across the area of the chip to promote current spreading and lateral current uniformity. In other embodiments, the chips 142, 143, 144, 145, 146, 147, 148 are laser diode chips, electronic integrated circuit chips, or the like. The lead portions 126, 128 of the buses 114, 116 extend off the substrate 112 and are suitably connected with an electrical power source (not shown). The buses 114, 116 conduct the electrical power to provide operating power to the chips 142, 143, 144, 145, 146, 147, 148.

Although not illustrated in FIG. 3, the chip package 110 can optionally include an encapsulant similar to the encapsulant 50 encapsulating the chips 142, 143, 144, 145, 146, 147, 148 and the chip bonding portions 120, 122 of the power buses 14, 16. Similarly, although not illustrated in FIG. 3, the parts of the lead portions 126, 128 that extend off the front principal surface of the circular substrate 112 can optionally be bent or wrapped around to the backside of the substrate 112, similar to the wrapping illustrated in FIGS. 2 and 2A, so as to provide backside electrical bonding pads for surface mounting.

In the embodiment illustrated in FIG. 3, an electrostatic discharge (ESD) protection device 152 is placed in parallel across the gap 140 to provide ESD protection for all seven chips 142, 143, 144, 145, 146, 147, 148. Moreover, in the embodiment illustrated in FIG. 3, a filtering capacitor 160 is also placed in parallel across the gap 140. The filtering capacitor 160 serves as a filter circuit providing low pass filtering of the electrical power delivered by the buses 114, 116. Similarly, other filtering circuits, which may include more than one electrical component, can provide low pass, high pass, or bandpass filtering of electrical power delivered by the electrical power buses.

The ESD devices 52, 152, and the filtering capacitor 160, are illustrative examples; more generally, substantially any circuit element or sub-circuit that performs a useful function when placed electrically in parallel across the first and second electrical power buses can be similarly included.

Figure 4:
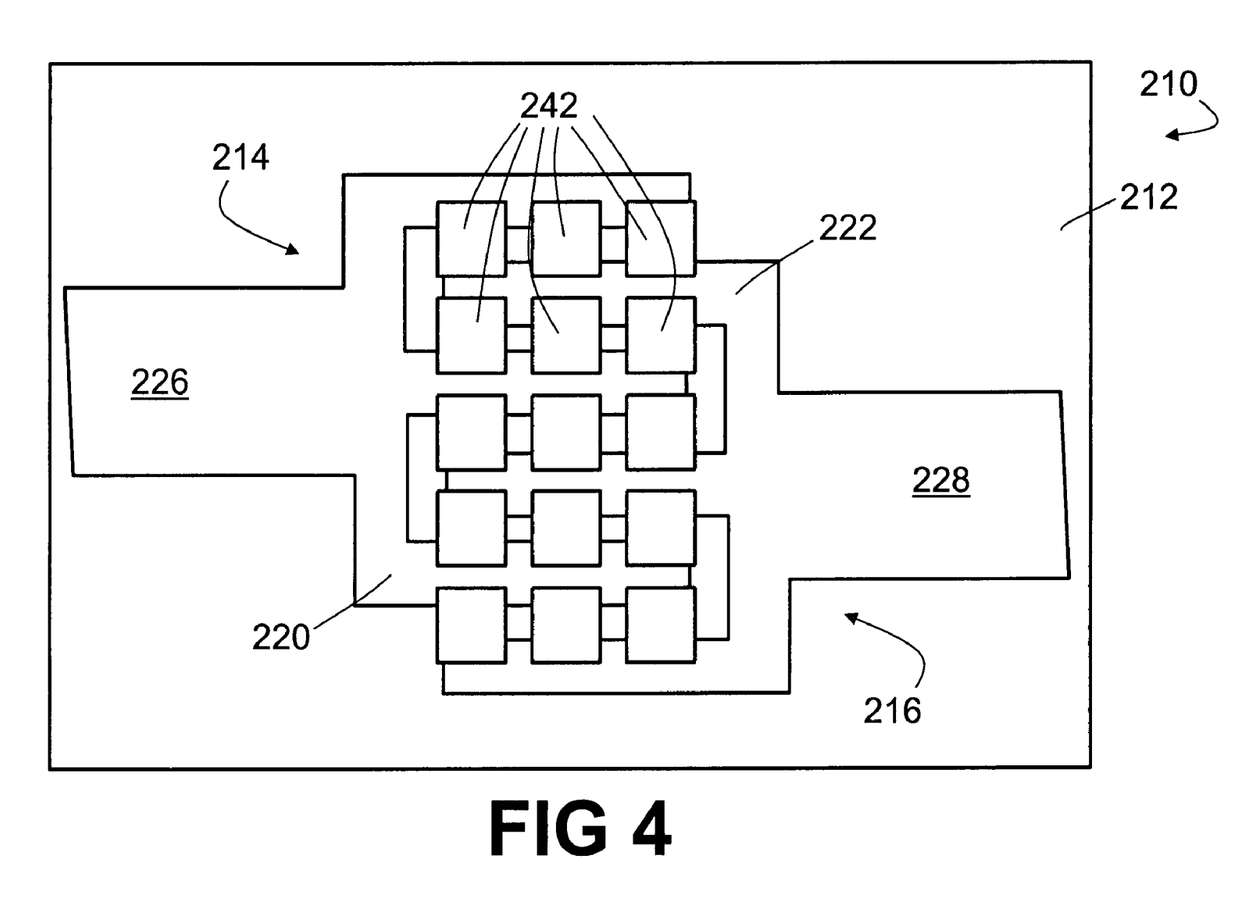
FIG. 4 shows a top view of a chip package including fifteen chips.
Figure 4A:
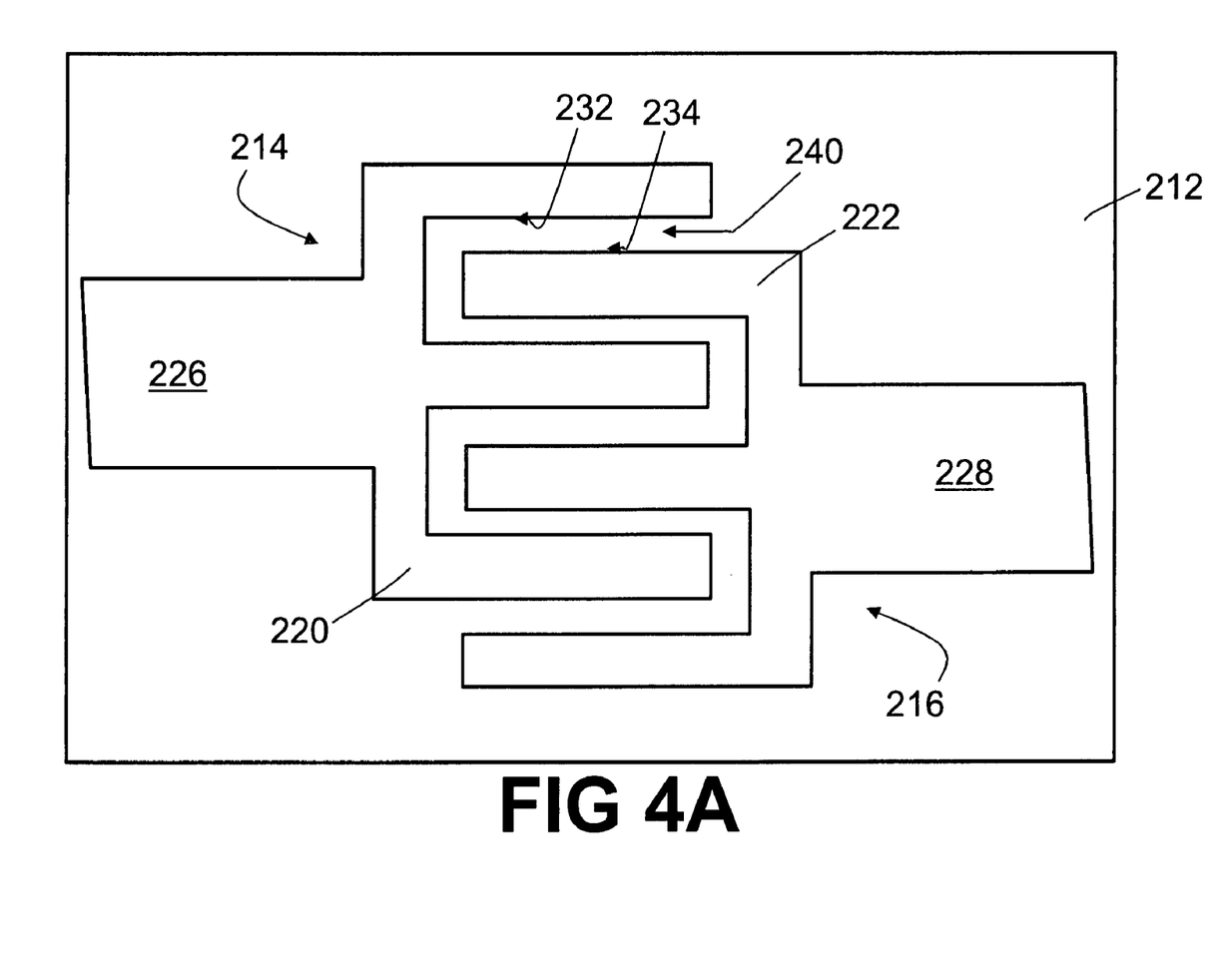
FIG. 4A shows a top view of the chip package of FIG. 4 with the fifteen chips removed to more clearly illustrate the interdigitated gap.

With reference to FIGS. 4 and 4A, another chip package 210 includes a substrate 212 on a set of planar electrical power buses 214, 216 is disposed. The buses 214, 216 include interdigitated chip bonding regions 220, 222, respectively, and lead portions 226, 228, respectively, extend away from the chip bonding region. The chip bonding regions 220, 222 have edges 232, 234, respectively, which define a compact serpentine gap 240. The planar electrical power buses 214, 216 are cut metal sheets or other electrically conductive sheets having the selected shape. A plurality of chips, specifically fifteen chips 242 in FIG. 4, straddle the gap 240.

The gap 240 is rectilinear, consisting of mutually parallel or perpendicular segments. This rectilinear arrangement facilitates laying the chips 242 out in a regular rectangular array. Such a rectangular arrangement is compatible with automated step-and-bond semiconductor die bonding machinery. Moreover, a rectangular chip array can be advantageous when the chip package is intended as an optical illumination or optical communication module in which the chips 242 are optical chips such as light emitting diode chips, laser chips, or the like. For illumination applications, the rectangular array of chips 242 provides good uniformity of illumination over the compact chip bonding region from which light is emitted. For optical communication applications, the regular rectangular chip array provides straightforward coupling with a corresponding rectangular array of receiving optical fiber ends. The gap 240 is drawn rather wide in FIGS. 4 and 4A, rather than narrow, for illustrative convenience; in practical embodiments the gap 240 should be made as narrow as possible while still providing adequate electrical isolation, so as to minimize the thermal non-uniformities in chip heat removal due to the gap 240. Additionally or alternatively, the gap 240 can be filled with a thermally conductive but electrically insulating material to promote heat removal from the chips 242.

The serpentine gap 240 can have substantially any number of back-and-forth passes, and hence can support a substantially arbitrary number of chips in the direction transverse to the fingers of the chip bonding regions 220, 222. Similarly each of the fingers can have substantially any length, thus supporting a substantially arbitrary number of chips along the length of the fingers. As the number of chips increases, the current conducted by the lead portions 226, 228 increases. If the buses 214, 216 are cut from a metal sheet of fixed thickness, then the widths of the lead portions 226, 228 are suitably increased to handle the higher levels of electrical current.

Although not illustrated in FIGS. 4 and 4A, the chip package 210 can optionally include an encapsulant similar to the encapsulant 50 encapsulating the chips 242 and the chip bonding portions 220, 222 of the power buses 214, 216. As illustrated in FIGS. 4 and 4A, the lead portions 226, 228 reside entirely on the substrate 212, rather than extending off the front principal surface of the substrate. This arrangement of the lead portions 226, 228 is suitable for wire bonding to the lead portions. Alternatively, parts of the lead portions can extend off the substrate, as illustrated in FIGS. 1, 1A, and 1B, and can further be wrapped around to the backside of the substrate, as illustrated in FIGS. 2 and 2A, so as to provide backside electrical bonding pads for surface mounting.

The embodiments of FIGS. 3 and 4 are illustrative examples of how the chip bonding regions of the electrical power buses can have shapes selected to compact a relatively long electrical isolation gap into a relatively small aspect ratio. Those skilled in the art can readily design other shapes that provide desired arrangements of chips in chip bonding regions of selected aspect ratio.

It will be appreciated that the illustrated planar electrical power buses 14, 16 of FIGS. 1, 1A, and 1B have identical shapes, and that the buses 14', 16' of FIGS. 2 and 2A have identical shapes, and that the interdigitated power buses 214, 216 of FIGS. 4 and 4A have identical shapes. In the latter case, the bus 216 is rotated 180° to face the bus 214 to provide the desired interdigitated arrangement producing the gap 240. As such, the planar electrical power buses 14, 16 are interchangeable, the planar electrical power buses 14', 16' are interchangeable, and the planar electrical power buses 214, 216 are interchangeable. Such interchangeability is advantageous in mass production manufacturing.

Another advantage of the illustrated embodiments is that the lead portions 26, 26', 126, 226 of the first power buses 14, 14', 114, 214 and the lead portions 28, 28', 128, 228 of the second power buses 16, 16', 116, 216 extend away from the chip bonding region defined by the chip bonding portions 20, 22, 120, 122, 220, 222 in generally opposite directions. This spatial separation of the ends of the lead portions facilitates soldering or other electrical connection thereto without inadvertent electrical shorting across the lead ends by stray solder material.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A chip package comprising:
    an electrically insulating substrate having a front principal side;
    planar first and second electrical power buses each having a chip bonding portion and a lead portion extending away from the chip bonding portion, at least the chip bonding portions of the first and second electrical power buses being disposed on the front principal side of the substrate and having edges spaced apart from one another to define an extended electrical isolation gap; and
    a plurality of chips straddling the extended electrical isolation gap and electrically connected with the first and second electrical power buses to receive electrical power from the first and second electrical power buses.

2. The chip package as set forth in claim 1, wherein the lead portions of the planar first and second electrical power buses extend off the front principal side of the substrate.

3. The chip package as set forth in claim 2, wherein the lead portions of the planar first and second electrical power buses wrap around to a back principal side of the substrate opposite the front principal side.

4. The chip package as set forth in claim 1, wherein the chips include light emitting chips, the chip package further comprising:
    a light transmissive encapsulant disposed on the substrate and encapsulating the plurality of chips and the chip bonding portions of the planar first and second electrical power buses.

5. The chip package as set forth in claim 1, wherein the planar first electrical power bus is a rectangular strip, the planar second electrical power bus is a rectangular strip, and ends of the planar first and second electrical power buses are arranged offset in parallel with one another to define the extended electrical isolation gap.

6. The chip package as set forth in claim 1, wherein the planar first and second electrical power buses are interchangeable.

7. The chip package as set forth in claim 1, wherein (i) the chip bonding portion of the first power bus includes a broadened end and (ii) the chip bonding portion of the second power bus includes a broadened end that wraps around the broadened end of the chip bonding portion of the first power bus to define the extended electrical isolation gap.

8. The chip package as set forth in claim 1, wherein the chip bonding portions of the first and second power buses include interdigitated fingers that define the extended electrical isolation gap.

9. The chip package as set forth in claim 1, wherein the lead portions of the planar first and second electrical power buses extend away from a chip bonding region defined by the chip bonding portions of the first and second electrical power buses in generally opposite directions.

10. A chip package comprising:
    first and second electrical power buses each formed of an electrical conductor having a chip bonding portion and a lead portion extending away from the chip bonding portion, the chip bonding portions of the first and second electrical power buses having edges spaced apart from one another to define an extended electrical isolation gap; and a plurality of chips straddling the extended electrical isolation gap and electrically connected with the first and second electrical power buses to receive electrical power from the first and second electrical power buses.

11. The chip package as set forth in claim 10, further comprising:

an electrically insulating substrate, at least the chip bonding portions of the first and second electrical power buses being secured to a front side of the substrate.

12. The chip package as set forth in claim 11, wherein the electrically insulating substrate is also thermally insulating, heat generated by the plurality of chips being conducted from the chip bonding portions of the first and second power buses to distal ends of the lead portions of the first and second power buses.

13. The chip package as set forth in claim 11, wherein the lead portions of the first and second power buses extend off of the electrically insulating substrate.

14. The chip package as set forth in claim 13, wherein the lead portions of the first and second power buses wrap around to a back side of the electrically insulating substrate opposite the front side to define back side surface mount bonding pads.

15. The chip package as set forth in claim 10, wherein the electrical conductor forming the first electrical power bus is sheet metal, and the electrical conductor forming the second electrical power bus is sheet metal.

16. The chip package as set forth in claim 15, wherein the first and second electrical power buses are linear conductive strips arranged parallel to one another and relatively offset from one another to define neighboring and non-neighboring portions of each strip, the neighboring portions being the chip bonding portions and the non-neighboring portions being the lead portions.

17. The chip package as set forth in claim 10, further comprising:

an electrostatic discharge protection device straddling the extended electrical isolation gap and electrically connected across the first and second electrical power buses, the electrostatic discharge protection device providing electrostatic discharge protection for the plurality of chips.

18. The chip package as set forth in claim 10, further comprising:

a filter circuit straddling the extended electrical isolation gap and electrically connected across the first and second electrical power buses, the filter circuit providing one of low pass, high pass, and bandpass filtering for electrical power delivered by the first and second electrical power buses.

19. The chip package as set forth in claim 10, further comprising:

a filtering capacitor straddling the extended electrical isolation gap and electrically connected across the first and second electrical power buses, the filtering capacitor suppressing high frequency components of electrical power delivered by the first and second electrical power buses.

20. The chip package as set forth in claim 10, wherein the chips include light emitting diode chips, the chip package further comprising:

a light-transmissive encapsulant surrounding the light emitting diode chips and the chip bonding portions of the first and second electrical power buses.

* * * * *